US012469708B2

(12) United States Patent
Tseng et al.

(10) Patent No.: US 12,469,708 B2
(45) Date of Patent: Nov. 11, 2025

(54) BARRIER LAYER FOR CONTACT STRUCTURES OF SEMICONDUCTOR DEVICES

(71) Applicant: TAIWAN SEMICONDUCTOR MANUFACTURING Company, Ltd., Hsinchu (TW)

(72) Inventors: Hsin-Hsiang Tseng, Changhua County (TW); Chi-Ruei Yeh, New Taipei (TW); Tsung-Yu Chiang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 302 days.

(21) Appl. No.: 18/304,059

(22) Filed: Apr. 20, 2023

(65) Prior Publication Data
US 2023/0260792 A1    Aug. 17, 2023

Related U.S. Application Data

(62) Division of application No. 17/081,738, filed on Oct. 27, 2020, now Pat. No. 11,637,018.

(51) Int. Cl.
H01L 21/285 (2006.01)
H01L 21/3213 (2006.01)
H10D 30/01 (2025.01)
H10D 30/62 (2025.01)
H10D 64/62 (2025.01)

(52) U.S. Cl.
CPC .. *H01L 21/28518* (2013.01); *H01L 21/32133* (2013.01); *H10D 30/024* (2025.01); *H10D 30/6211* (2025.01); *H10D 30/6219* (2025.01); *H10D 64/62* (2025.01)

(58) Field of Classification Search
CPC ......... H01L 21/28518; H01L 21/32133; H01L 21/76849; H01L 21/76859; H01L 21/32134; H10D 30/024; H10D 30/6211; H10D 30/6219; H10D 64/62; H10D 84/0158; H10D 84/0149; H10D 84/038
See application file for complete search history.

(56) References Cited

U.S. PATENT DOCUMENTS

| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |

(Continued)

*Primary Examiner* — Allison Bernstein
(74) *Attorney, Agent, or Firm* — Sterne, Kessler, Goldstein & Fox P.L.L.C.

(57) ABSTRACT

The present disclosure describes a semiconductor device with a diffusion barrier layer on source/drain (S/D) contact structures and a method of fabricating the semiconductor device. The method of fabricating the semiconductor device includes forming a S/D region on a fin structure, forming a S/D contact structure including a metal on the S/D region, forming a barrier layer including silicon and the metal on the S/D contact structure, and forming a via contact structure on the barrier layer. The barrier layer blocks a diffusion of the metal in the S/D contact structure to the via contact structure.

20 Claims, 9 Drawing Sheets

(56) References Cited

U.S. PATENT DOCUMENTS

| | | |
|---|---|---|
| 9,576,814 B2 | 2/2017 | Wu et al. |
| 9,831,183 B2 | 11/2017 | Lin et al. |
| 9,859,386 B2 | 1/2018 | Ho et al. |
| 10,964,792 B1 * | 3/2021 | Cheng .................. H10D 84/038 |
| 11,069,784 B2 * | 7/2021 | Tsai .................. H01L 21/76849 |
| 11,532,561 B2 * | 12/2022 | Lin .................. H01L 21/31116 |
| 2007/0181954 A1 | 8/2007 | Oikawa |
| 2010/0013029 A1 | 1/2010 | Chuang et al. |
| 2018/0254246 A1 | 9/2018 | Park et al. |
| 2019/0304833 A1 | 10/2019 | Chen et al. |
| 2022/0005934 A1 | 1/2022 | Park et al. |

* cited by examiner

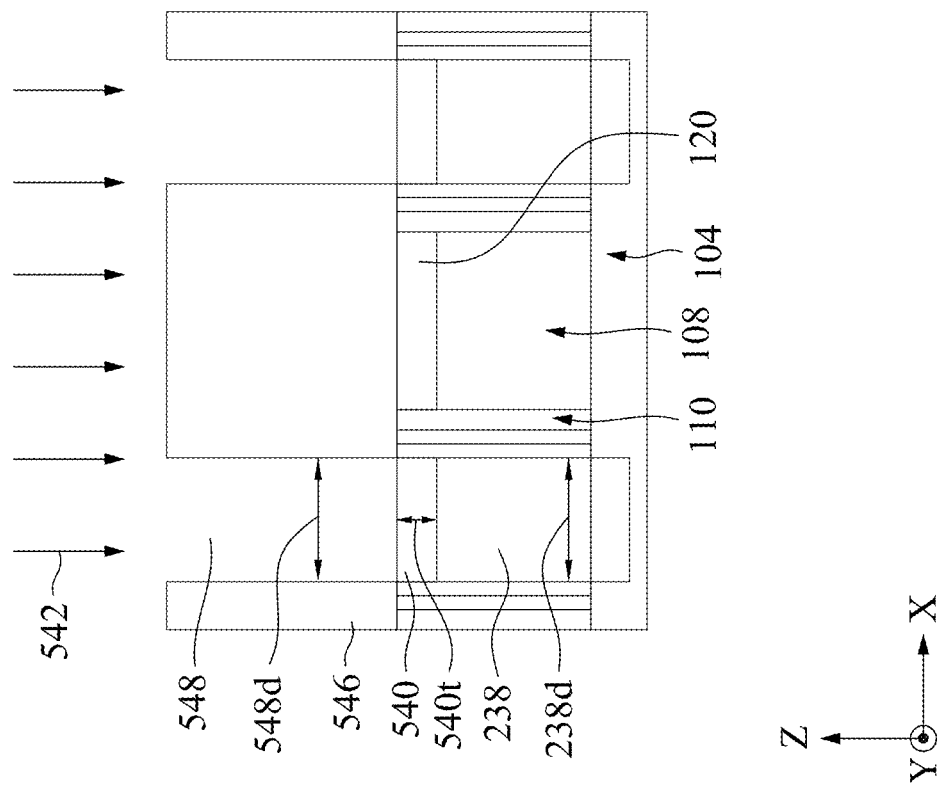
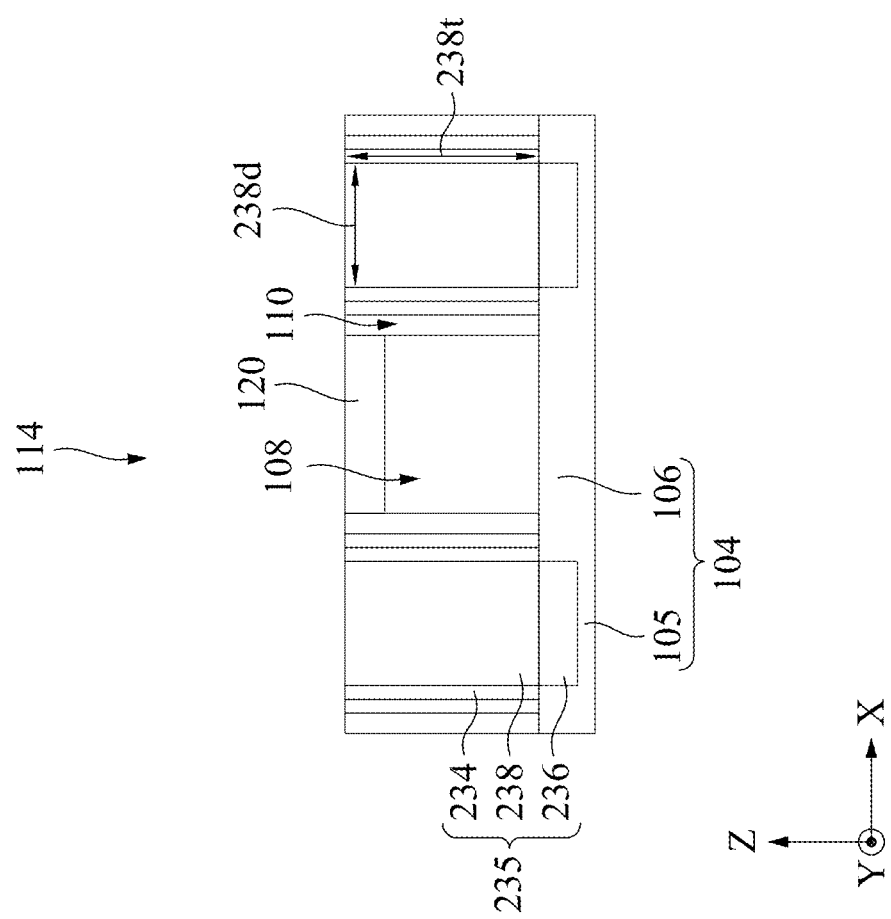
FIG. 5
FIG. 4

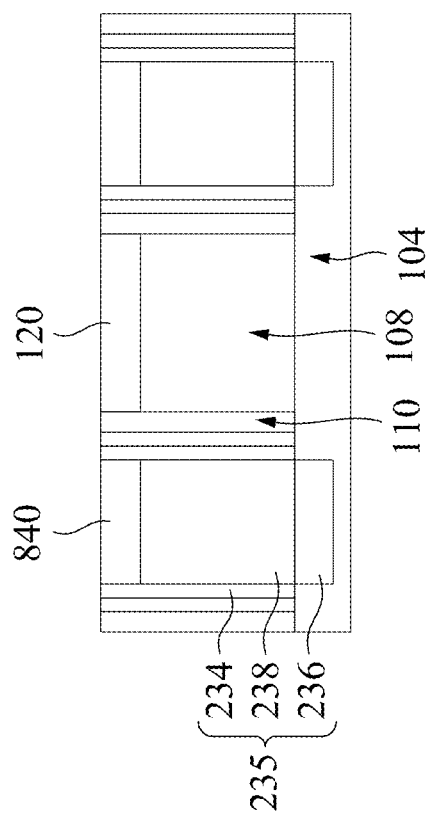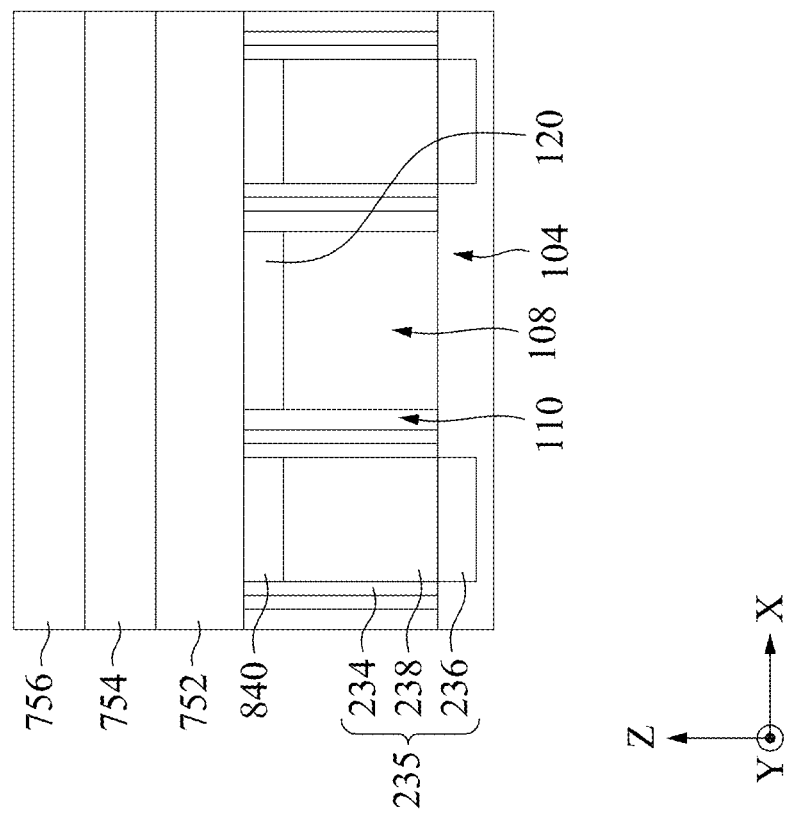
FIG. 8
FIG. 9

BARRIER LAYER FOR CONTACT STRUCTURES OF SEMICONDUCTOR DEVICES

CROSS-REFERENCE TO RELATED APPLICATION

This application is a divisional of U.S. Non-Provisional patent application Ser. No. 17/081,738, filed on Oct. 27, 2020, titled "Barrier Layer for Contact Structures of Semiconductor Devices," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

FIGS. 4-11 illustrate cross-sectional views of various semiconductor devices with a diffusion barrier layer on S/D contact structures at various stages of their fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
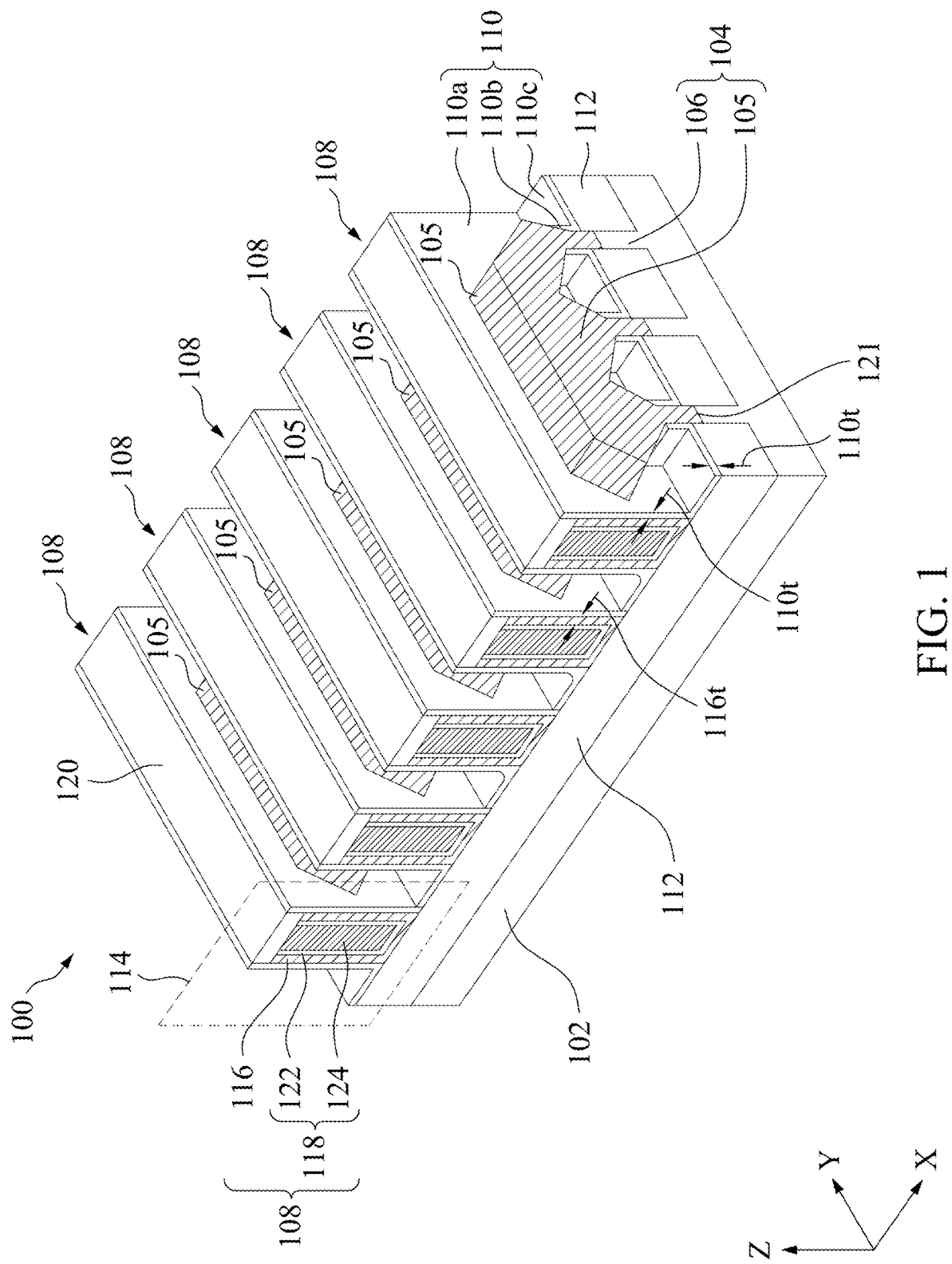
FIG. 1 illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers can be formed alongside the patterned sacrificial layer using a self-aligned process. The sacrificial layer is then removed, and the remaining spacers can then be used to pattern the fin structures.

The scaling down of FET devices has increased the complexity of fabricating via contact structures on S/D contact structures with reduced resistivity. The S/D contact structures and via contact structures can connect the FET devices with interconnect structures. Reducing the resistance between the FET devices and the interconnect structures can improve device performance of the FET devices. According to some embodiments, S/D contact structures can include cobalt (Co) and via contact structures can include tungsten (W). W can block a diffusion of Co from the S/D contact structures to the via contact structures. The resistance of W via contact structures with liners as adhesion layer can be high for via contact structures with reduced dimensions. Other conductive materials (e.g., ruthenium (Ru)) having a lower resistivity than W can be used for via contact structures to reduce the resistance. However, Co in the S/D contact structures can diffuse to the via contact structures without W blocking the diffusion of Co. The diffusion of Co can form voids in the S/D contact structures and thereby decrease the reliability of the FET devices.

Various embodiments in the present disclosure provide example diffusion barrier layers on S/D contact structures in field effect transistors (FET) devices (e.g., finFETs, gate-all-around FETs, MOSFETs, etc.) and/or other semiconductor devices in an integrated circuit (IC) and example methods for fabricating the same. The example methods in the present disclosure can form a semiconductor device having a source/drain (S/D) region on a fin structure, a S/D contact structure on the S/D region, a diffusion barrier layer on the S/D contact structure, and a via contact structure on the diffusion barrier layer. In some embodiments, the diffusion barrier layer can be formed by implanting a top portion of the S/D contact structure and anneal the implanted top portion of the S/D contact structure. In some embodiments, the diffusion barrier layer can be formed by treating the S/D contact structure with a silicon-containing gas and anneal the treated S/D contact structure. In some embodiments, the diffusion barrier layer can be formed by depositing a semiconductor layer on the S/D contact structure, a glue layer on the semiconductor layer, and a cap layer on the glue layer followed by an anneal process. The semiconductor layer can include silicon and a dopant to diffuse into the S/D contact structure and form a doped diffusion barrier layer. The dopant in the doped diffusion barrier layer can reduce the resistance of the diffusion barrier layer. The cap layer can prevent the dopant outgassing from the semiconductor layer during the anneal process and the glue layer can improve adhesion of the cap layer on the semiconductor layer. In some embodiments, the diffusion barrier layer can be formed on the semiconductor device without pattern loading problems (e.g., different thicknesses of deposited layers on different areas of the semiconductor devices using a deposition process) compared to depositing patterned diffusion barrier layers.

In some embodiments, the S/D contact structure can include a metal (e.g., Co) and the diffusion barrier layer can include silicon and the metal. In some embodiments, the via contact structure can include another metal (e.g., Ru) having a lower resistivity than W to reduce the resistance between the semiconductor devices and interconnect structures. In some embodiments, the diffusion barrier layer can block a diffusion of the metal from the S/D contact structure to the via contact structure. In some embodiments, the via contact structure can have a first portion in the diffusion barrier layer and a second portion above the diffusion barrier layer. The first portion can have a diameter larger than the second portion, thereby reducing contact resistances between the diffusion barrier layer and the via contact structures and further reducing the resistance between the semiconductor devices and the interconnect structures. In some embodiments, Ru-based via contact structures with the diffusion barrier layer can reduce the resistance between the semiconductor devices and the interconnect structures by about 50% to about 70% compared to W-based via contact structures with similar dimensions and no diffusion barrier layer.

Though the present disclosure describes the diffusion barrier layer on S/D contact structures of a finFET, the diffusion barrier layer formed on S/D contact structures and the methods for forming these structures described herein can be applied to other FETs and other semiconductor devices, such as gate-all-around (GAA) FETs, MOSFETs, and passive devices.

FIG. 1 illustrates an isometric view of a semiconductor device 100, according to some embodiments. The isometric view of semiconductor device 100 is shown for illustration purposes and may not be drawn to scale. Semiconductor device 100 can be formed on a substrate 102 and can include fin structures 104, gate structures 108 disposed on fin structures 104, spacers 110 disposed on opposite sides of gate structures 108, shallow trench isolation (STI) regions 112, and gate capping structures 120 disposed on gate structures 108. Though FIG. 1 shows five gate structures 108 for five FET devices, semiconductor device 100 can include one or more FET devices and one or more gate structures similar and parallel to gate structures 108.

Substrate 102 can include a semiconductor material such as, but not limited to, silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

Fin structures 104 represent current carrying structures of semiconductor device 100 and can extend along an X-axis and through gate structures 108. Fin structures 104 can include: (i) epitaxial fin regions 105 disposed on opposing sides of gate structures 108; and (ii) fin regions 106 underlying epitaxial fin regions 105 and gate structures 108. Epitaxial fin regions 105 can form source/drain (S/D) regions of semiconductor device 100 and the portions of fin regions 106 underlying gate structures 108 can form the channel regions (not shown) of semiconductor device 100. Fin regions 106 can be formed from patterned portions of substrate 102 and form interfaces 121 with epitaxial fin regions 105. In some embodiments, interfaces 121 can be coplanar with top surface of STI regions 112 or top surface of substrate 102. Though semiconductor device 100 is shown to have merged epitaxial fin regions 105 on three fin regions 106, semiconductor device 100 can have an individual epitaxial fin region similar in composition to epitaxial fin regions 105 on each of fin regions 106.

Each of epitaxial fin regions 105 can include an epitaxially-grown semiconductor material. In some embodiments, the epitaxially grown semiconductor material can include the same material as the material of substrate 102. In some embodiments, the epitaxially-grown semiconductor material can include a different material from the material of substrate 102. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

Each of epitaxial fin regions 105 can be p-type or n-type. Each of p-type epitaxial fin regions 105 can include SiGe, Si, silicon germanium bromide (SiGeB), Ge or III-V materials (e.g., indium antimonide (InSb), gallium antimonide (GaSb), or indium gallium antimonide (InGaSb)) and can be in-situ doped during an epitaxial growth process using p-type dopants, such as boron, indium, and gallium. For p-type in-situ doping, p-type doping precursors, such as diborane ($B_2H_6$), boron trifluoride ($BF_3$), and other p-type doping precursors, can be used. Each of epitaxial fin regions 105 can include multiple epitaxial fin regions that can differ from each other based on, for example, doping concentration, and/or epitaxial growth process conditions.

Gate structures 108 can include a gate dielectric layer 116 and a gate electrode 118 disposed on gate dielectric layer 116. Gate structures 108 can be formed by a gate replacement process. In some embodiments, gate dielectric layer 116 can have a thickness 116t in a range from about 1 nm to about 5 nm. Gate dielectric layer 116 can include silicon oxide and can be formed by chemical vapor deposition (CVD), atomic layer deposition (ALD), physical vapor deposition (PVD), or other suitable processes. In some embodiments, gate dielectric layer 116 can include (i) a layer of silicon oxide, silicon nitride, and/or silicon oxynitride, (ii) a high-k dielectric material, such as hafnium oxide ($HfO_2$), titanium oxide ($TiO_2$), and zirconium oxide ($ZrO_2$), (iii) a high-k dielectric material having oxides of lithium (Li), zirconium (Zr), aluminum (Al), lanthanum (La), or lutetium (Lu), or (iv) a combination thereof. High-k dielectric layers can be formed by ALD and/or other suitable methods. In some embodiments, gate dielectric layer 116 can include a single layer or a stack of insulating material layers.

In some embodiments, gate electrode 118 can include a gate barrier layer (not shown), a gate work function layer 122, and a gate metal fill layer 124. Gate barrier layer can serve as a nucleation layer for subsequent formation of gate work function layer 122 and/or can help to prevent substantial diffusion of metals (e.g., Al) from gate work function layer 122 to underlying layers (e.g., gate dielectric layer 116). Gate work function layer 122 can include a single metal layer or a stack of metal layers. The stack of metal layers can include metals having work function values equal to or different from each other. Gate metal fill layer 124 can include a single metal layer or a stack of metal layers. The stack of metal layers can include metals different from each other. In some embodiments, gate metal fill layer 124 can include a suitable conductive material, such as titanium (Ti), silver (Ag), Al, metal alloys, and/or combinations thereof.

Each of spacers 110 can include spacer portions 110a that form sidewalls of gate structures 108 and are in contact with gate dielectric layer 116, spacer portions 110b that form sidewalls of fin structures 104, and spacer portions 110c that form protective layers on STI regions 112. Spacers 110 can include insulating material, such as silicon oxide, silicon nitride, a low-k material, and a combination thereof. Spacers 110 can have a low-k material with a dielectric constant less than 3.9 (e.g., less than 3.5, 3, or 2.8). In some embodiments, each of spacers 110 can have a thickness 110t in a range from about 5 nm to about 10 nm. In some embodiments, spacers 110 can include a stacked of layers, such as spacers 110-1 and spacers 110-2 shown in FIGS. 2A and 2B. In some embodiments, spacers 110-1 and spacers 110-2 can include different insulating materials.

STI regions 112 can provide electrical isolation to semiconductor device 100 from neighboring active and passive elements (not shown) integrated with or deposited onto substrate 102. STI regions 112 can have a dielectric material, such as silicon oxide, silicon nitride, silicon oxynitride, fluorine-doped silicate glass (FSG), a low-k dielectric material, and/or other suitable insulating materials. In some embodiments, STI regions 112 can include a multi-layered structure.

Gate capping structures 120 can be disposed on gate structures 108 and configured to protect underlying structures and/or layers during processing of semiconductor device 100. For example, gate capping structures 120 can act as an etch stop layer during the formation of S/D contact structures on epitaxial fin regions 105. Gate capping structures 120 can include one or more insulating materials. In some embodiments, the insulating materials can include silicon oxide ($SiO_x$), aluminum oxide ($AlO_x$), silicon nitride ($SiN_x$), or other suitable materials.

Figure 2A:
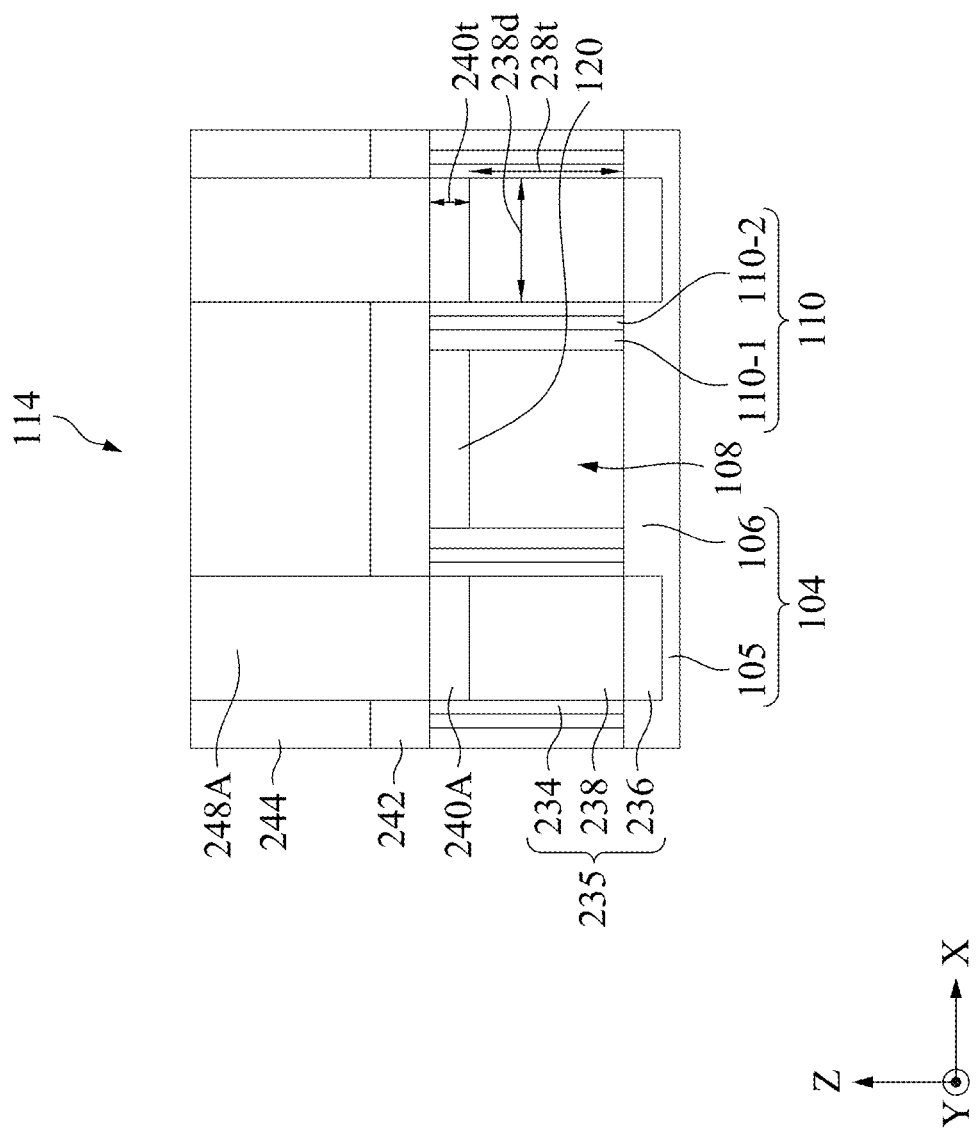
FIGS. 2A-2C illustrate partial cross-sectional views of a semiconductor device with a diffusion barrier layer on source/drain (S/D) contact structures, in accordance with some embodiments.

Semiconductor device 100 can include additional elements, such as S/D contact structures 235, diffusion barrier layers 240A-240B, etch stop layers (ESL) 242, interlayer dielectric (ILD) layer 244, and via contact structures 248A-248B, which are illustrated and described with reference to FIGS. 2A-2C. Elements in FIGS. 2A-2C with the same annotations as elements in FIG. 1 are described above. FIGS. 2A and 2B are cross-sectional views of area 114 of semiconductor device 100 in FIG. 1 having various configurations of diffusion barrier layers and via contact structures. In some embodiments, via contact structures 248A can be disposed on diffusion barrier layers 240A, as shown in FIG. 2A. In some embodiments, via contact structures 248B can have a portion in diffusion barrier layers 240B as shown in FIG. 2B to further reduce contact resistance. The area 114 can be along an XZ plane through fin structures 104 and gate structures 108 adjacent to them. These additional elements of semiconductor device 100 are not shown in FIG. 1 for the sake of clarity. Though FIG. 2A shows S/D contact structures 235, diffusion barrier layers 240A-240B, and via contact structures 248A-248B formed on one of fin structures 104, respectively, these structures can be similarly formed on the other fin structures 104 and gate structures 108 shown in FIG. 1.

Referring to FIG. 2A, S/D contact structures 235 can be configured to electrically connect fin structures 104 to other elements of semiconductor device 100 and/or of the integrated circuit (not shown). S/D contact structures 235 can be disposed on and in electrical contact with fin structures 104 (e.g., epitaxial fin regions 105 of fin structures 104). In some embodiments, each of S/D contact structures 235 can include (i) a silicide layer 236, (ii) a S/D contact glue layer 234, and (iii) a metal contact 238.

Silicide layer 236 can be disposed on or within fin structures 104 and can have a thickness along a Z-axis in a range from about 2 nm to about 25 nm. Silicide layer 236 can provide a low resistance interface between fin structures 104 and metal contact 238. Silicide layer 236 can include titanium (Ti), nickel (Ni), Co, W, or other suitable metals. In some embodiments, silicide layer 236 can include a metal silicide-dopant complex material that can be formed from dopants included during the formation of silicide layer 236.

S/D contact glue layer 234 can be disposed along sidewalls of metal contact 238, as shown in FIGS. 2A and 2B. In some embodiments, S/D contact glue layer 234 can include a single layer or a stack of conductive materials, such as titanium nitride (TiN), Ti, Ni, tantalum (Ta), tantalum nitride (TaN), and a combination thereof. In some embodiments, S/D contact glue layer 234 can act as an adhesion-promoting-layer, a glue-layer, a primer-layer, a protective-layer, and/or a nucleation-layer. For example, S/D contact glue layer 234 can include a layer of TiN to improve Co adhesion. S/D contact glue layer 234 can have a thickness along an X-axis in a range from about 1 nm to about 5 nm, according to some embodiments.

Metal contact 238 can be disposed within S/D contact glue layer 234 and on silicide layer 236 and can include a metal, such as Co, W, Al, Ru, and other suitable metals. In some embodiments, metal contact 238 can include a stack of Co layers deposited by various deposition processes. In some embodiments, metal contact 238 can have a horizontal dimension 238$d$ (e.g., width or diameter) along an X-axis in a range from about 10 nm to about 50 nm. Metal contact 238 can have a vertical dimension 238$t$ (e.g., thickness) along a Z-axis ranging from about 5 nm to about 40 nm.

Figure 2C:
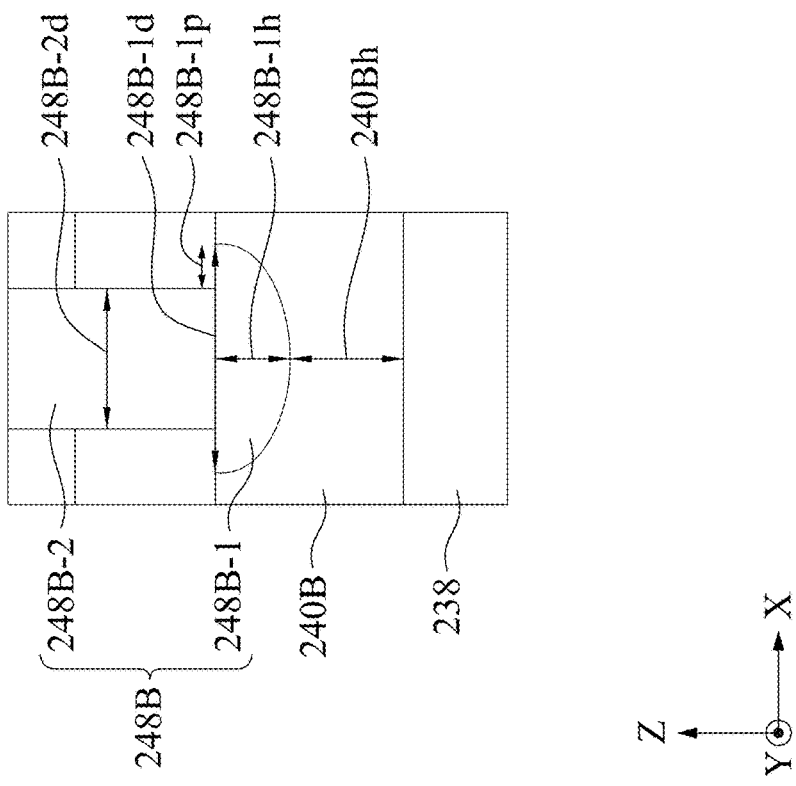
Figure 2B:
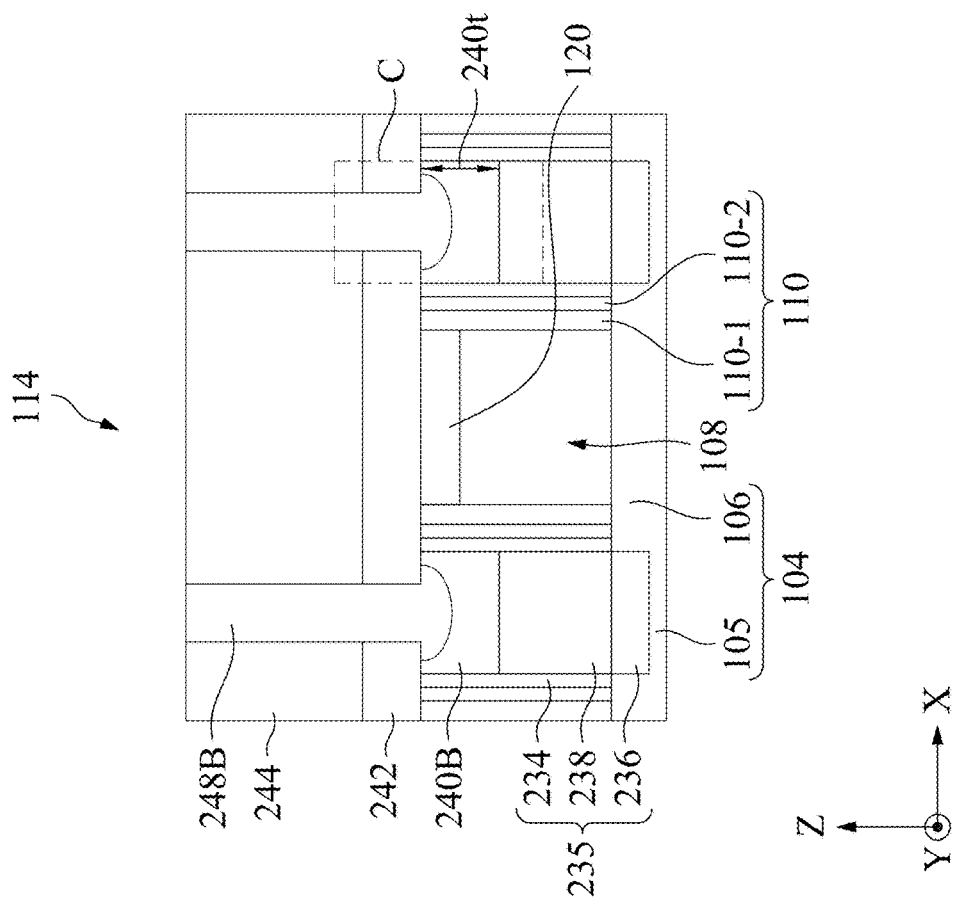

Referring to FIGS. 2A-2C, ESL 242 can be configured to protect gate structures 108 and S/D contact structures 235 during, for example, the formation of via contact structures 248A-248B. ESL 242 can be disposed on spacers 110, gate capping structures 120, and S/D contact structures 235. In some embodiments, ESL 242 can include, for example, silicon nitride (SiN$_x$), silicon oxide (SiO$_x$), silicon oxynitride (SiON), silicon carbide (SiC), silicon carbo-nitride (SiCN), boron nitride (BN), silicon boron nitride (SiBN), silicon carbon boron nitride (SiCBN), silicon oxycarbide (SiOC), silicon oxycarbonitride (SiOCN), or a combination thereof. In some embodiments, ESL 242 can have a thickness along a Z-axis in a range from about 3 nm to about 20 nm.

ILD layer 244 can be disposed on ESL 242 and can isolate via contact structures 248A-248B from each other and from other structures. ILD layer 244 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material can be silicon oxide. In some embodiments, ILD layer 244 can have a thickness along a Z-axis in a range from about 3 nm to about 200 nm. In some embodiments, ILD layer 244 can include a stack of dielectric layers.

Referring to FIGS. 2A-2C, via contact structures 248A-248B can be disposed above S/D contact structures 235 and separated from S/D contact structures 235 by diffusion barrier layers 240A-240B, respectively. In some embodiments, via contact structures 248A-248B can include Ru, selectively-deposited W, CVD-deposited W, ALD-deposited W, cobalt (Co), and/or other suitable low resistivity metals to reduce the resistance between S/D contact structures 235 and interconnect structures (not shown) on via contact structures 248A-248B.

Figure 12:
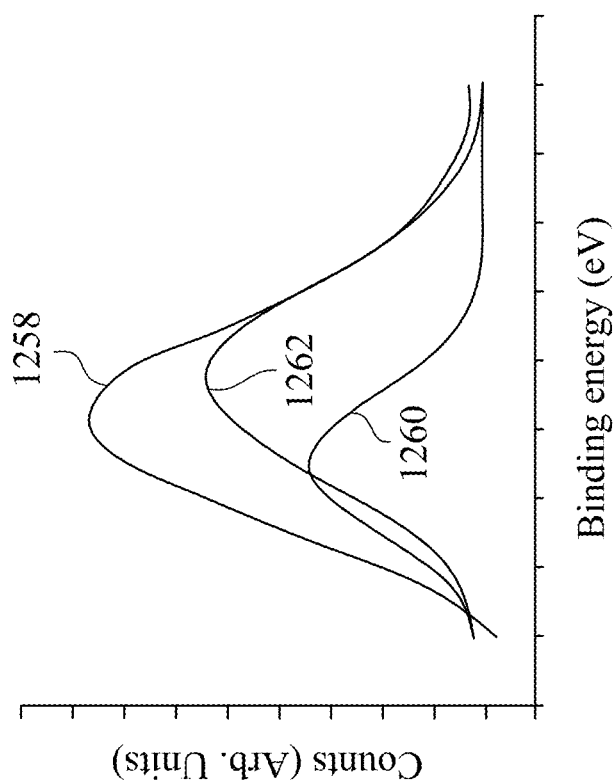
FIG. 12 illustrates binding energy distributions for cobalt monosilicide and cobalt disilicide, in accordance with some embodiments.

Referring to FIGS. 2A-2C, diffusion barrier layers 240A-240B can be disposed between S/D contact structures 235 and via contact structures 248A-248B, respectively. In some embodiments, diffusion barrier layers 240A-240B can be silicide layers and include silicon and the metal of metal contact 238 to block a diffusion of the metal in metal contact 238 to via contact structures 248A. For example, diffusion barrier layers 240A-240B can include cobalt monosilicide (CoSi) and cobalt disilicide (CoSi$_2$) to block a diffusion of Co in metal contact 238 to Ru-based via contact structures 248A. Referring to FIG. 12, profile 1260 can represent a binding energy distribution for Co, profile 1262 can represent a binding energy distribution for Co silicides, and profile 1258 can represent a binding energy distribution for a combination of Co and Co silicides. As shown in FIG. 12, Co silicides can have higher binding energies than Co and thereby block a diffusion of Co.

In some embodiments, as shown in FIG. 2A, diffusion barrier layers 240A can be disposed on metal contact 238 of S/D contact structures 235 to block a diffusion of the metal in metal contact 238 to via contact structures 248A. Diffusion barrier layers 240A can have a vertical dimension 240$t$ (e.g., thickness) along a Z-axis ranging from about 1 nm to about 15 nm. If vertical dimension 240$t$ is less than about 1 nm, diffusion barrier layers 240A may not block the diffusion of the metal. If vertical dimension 240$t$ is greater than about 15 nm, the contact resistance between S/D contact structures 235 and via contact structures 248A may increase.

In some embodiments, as shown in FIGS. 2B and 2C, diffusion barrier layers 240B can have a concave top surface and can be disposed on metal contact 238 to block a diffusion of the metal contact 238 to via contact structures 248A. FIG. 2C illustrates an enlarged view of area C in FIG. 2B, in accordance with some embodiments. Via contact structures 248B can include a first portion 248B-1 in diffusion barrier layers 240B and a second portion 248B-2 above diffusion barrier layers 240B to reduce the contact resistance between diffusion barrier layers 240B and via contact structures 248B. First portion 248B-1 can have a horizontal dimension 248B-1$d$ (e.g., diameter) along an X-axis ranging from about 12 nm to about 50 nm. Second portion 248B-2 can have a horizontal dimension 248B-2$d$ (e.g., diameter) along an X-axis ranging from about 10 nm to about 15 nm. In some embodiments, horizontal dimension 248B-2$d$ can be larger than horizontal dimension 248B-1$d$. As shown in FIGS. 2B and 2C, a horizontal dimension 248B-1$p$ (e.g., peripheral distance) along an X-axis can illustrate a difference between horizontal dimension 248B-1$d$ and horizontal dimension 248B-2$d$ at each side of second portion 248B-2. In some embodiments, horizontal dimension 248B-1$p$ can range from about 1 nm to about 10 nm. In some embodiments, a ratio of horizontal dimension 248B-1$d$ to horizontal dimension 248B-2$d$ can range from about 1.05 to about 1.7. If the ratio is less than about 1.05, or horizontal dimension 248B-1$p$ is less than about 1 nm, first portion 248B-1 may not reduce the contact resistance between diffusion barrier layers 240B and via contact structures 248B. If the ratio is greater than about 1.7, or horizontal dimension 248B-1$p$ is greater than about 10 nm, diffusion barrier layers 240B may not block the diffusion of the metal from metal contact 238 to via contact structures 248B. In some embodiments, diffusion barrier layers 240B can have a concave top surface in contact with first portion 248B-1 to increase the contact area and further reduce the contact resistance between diffusion barrier layers 240B and via contact structures 248B.

In some embodiments, first portion 248B-1 of via contact structures 248B can have a vertical dimension 248B-1$h$ (e.g., height) along a Z-axis ranging from about 1 nm to about 14 nm. Diffusion barrier layers 240B can have vertical dimension 240$t$ (e.g., thickness) along a Z-axis ranging from about 1 nm to about 15 nm. A portion of diffusion barrier layers 240B under first portion 248B-1 can have a vertical dimension 240B$h$ (e.g., height) along a Z-axis ranging from about 1 nm to about 10 nm. A ratio of vertical dimension 248B-1$h$ of first portion 248B-1 to vertical dimension 240$t$ of diffusion barrier layers 240B can range from about 0.1 to about 0.97. If the ratio is less than about 0.1, or vertical dimension 248B-1$h$ is less than about 1 nm, first portion 248B-1 may not reduce the contact resistance between diffusion barrier layers 240B and via contact structures 248B. If the ratio is greater than about 0.97, or vertical dimension 248B-1h is greater than about 14 nm, diffusion barrier layers 240B may not block the diffusion of the metal from metal contact 238 to via contact structures 248B. In some embodiments, diffusion barrier layers 240B including cobalt silicides. Vertical dimension 248B-1h can range from about 5 nm to about 10 nm, vertical dimension 248B-1p can range from about 3 nm to about 8 nm, and vertical dimension 240Bh can range from about 2 nm to about 5 nm.

In some embodiments, Ru-based via contact structures 248A-248B with diffusion barrier layers 240A-240B including Co silicides can have lower resistivity than W-based via contact structures 248A-248B having similar dimensions without diffusion barrier layers on Co-based S/D contact structures 235. In some embodiments, Ru-based via contact structures 248A-248B can have no glue layers and W-based via contact structures may require glue layers. Glue layers can have higher resistance than Ru-based via contact structures 248A-248B. As a result, the resistance of via contact structures 248A-248B can be further reduced for Ru-based via contact structures 248A-248B without glue layers. In some embodiments, Ru-based via contact structures 248A-248B with diffusion barrier layers 240A-240B can reduce the resistance between Co-based S/D contact structures 235 and the interconnect structures by about 50% to about 70% compared to W-based via contact structures having similar dimensions and no diffusion barrier layer. In some embodiments, Ru-based via contact structures 248A-248B with diffusion barrier layers 240A-240B can be formed on other structures (e.g., gate contact structures and passive devices) to reduce the resistance between the other structures and interconnect structures.

Figure 3:
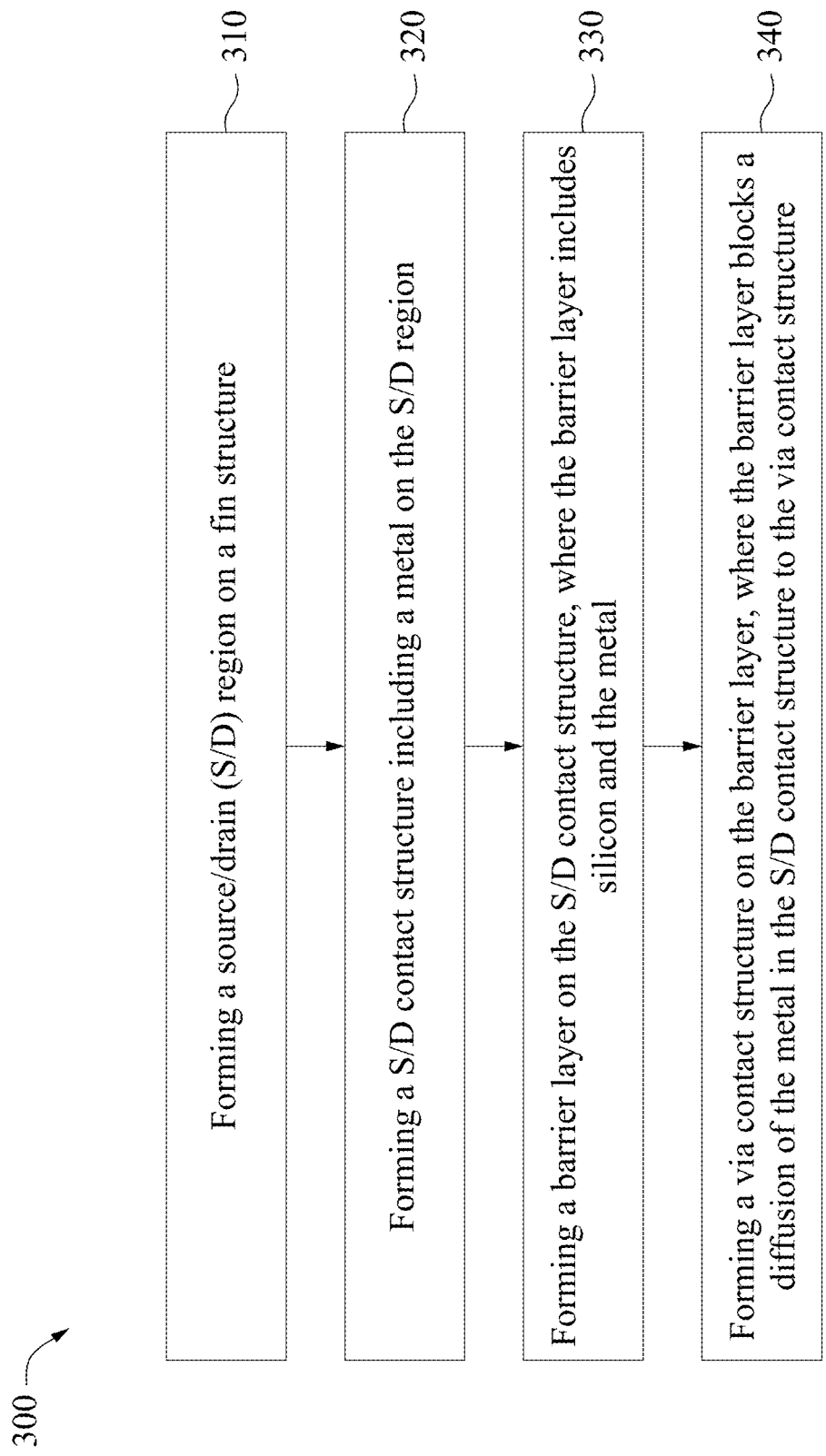
FIG. 3 is a flow diagram of a method for fabricating a semiconductor device with a diffusion barrier layer on S/D contact structures, in accordance with some embodiments.

FIG. 3 is a flow diagram of a method 300 for fabricating semiconductor device 100 with a diffusion barrier layer on S/D contact structures, in accordance with some embodiments. Method 300 may not be limited to finFET devices and can be applicable to devices that would benefit from the diffusion barrier layer on S/D contact structures, such as planar FETs, finFETs, GAA FETs, etc. Additional fabrication operations may be performed between various operations of method 300 and may be omitted merely for clarity and ease of description. Additional processes can be provided before, during, and/or after method 300; one or more of these additional processes are briefly described herein. Moreover, not all operations may be needed to perform the disclosure provided herein. Additionally, some of the operations may be performed simultaneously or in a different order than shown in FIG. 3. In some embodiments, one or more other operations may be performed in addition to or in place of the presently described operations.

For illustrative purposes, the operations illustrated in FIG. 3 will be described with reference to the example fabrication process for fabricating semiconductor device 100 as illustrated in FIGS. 4-11. FIGS. 4-11 are partial cross-sectional views of area 114 of semiconductor device 100 in FIG. 1 at various stages of its fabrication, according to some embodiments. Although FIGS. 4-11 illustrate fabrication processes of semiconductor device 100 with a diffusion barrier layer on S/D contact structures, method 300 can be used to form a diffusion barrier layer on other structures (e.g., gate contact structures). Elements in FIGS. 4-11 with the same annotations as elements in FIGS. 1-2C are described above.

In referring to FIG. 3, method 300 begins with operation 310 and the process of forming a source/drain (S/D) region on a fin structure. For example, as shown in FIGS. 1 and 4, epitaxial fin regions 105 can be formed on fin structures 104 and act as a S/D region. In some embodiments, epitaxial fin regions 105 can be epitaxially grown on fin structures 104. Epitaxial fin regions 105 can be in-situ doped p-type or n-type during the epitaxial growth. In some embodiments, epitaxial fin regions 105 can include multiple epitaxial fin regions that can differ from each other based on, for example, doping concentration and/or epitaxial growth process conditions.

Referring to FIG. 3, in operation 320, a S/D contact structure including a metal can be formed on the S/D region. For example, as shown in FIG. 4, S/D contact structures 235 can be formed on epitaxial fin regions 105 and can include a metal in metal contact 238. In some embodiments, S/D contact structures 235 can include silicide layer 236, S/D contact glue layer 234, and metal contact 238. The formation of S/D contact structures 235 can include formation of silicide layer 236, formation of S/D contact glue layer 234, and formation of metal contact 238 followed by a chemical mechanical process (CMP) to coplanarize top surfaces of metal contact 238, S/D contact glue layer 234, spacers 110, and gate capping structures 120. In some embodiments, silicide layer 236 can include titanium silicide (TiSi). In some embodiments, S/D contact glue layer 234 can include TiN and have a thickness along an X-axis ranging from about 1 nm to about 5 nm. In some embodiments, metal contact 238 can include a metal, such as Co, W, Al, Ru, and other suitable metals. In some embodiments, metal contact 238 can have a horizontal dimension 238d (e.g., width or diameter) along an X-axis in a range from about 10 nm to about 50 nm. Metal contact 238 can have a vertical dimension 238t (e.g., thickness) along a Z-axis ranging from about 5 nm to about 40 nm.

Figure 6:
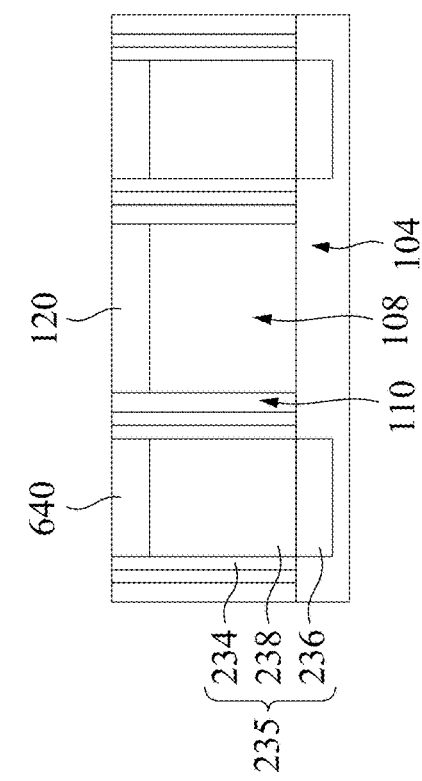

Referring to FIG. 3, in operation 330, a barrier layer can be formed on the S/D contact structure. The barrier layer includes silicon and the metal in metal contact 238. For example, as shown in FIGS. 5 and 6, diffusion barrier layers 640 can be formed on S/D contact structures 235. In some embodiments, the formation of diffusion barrier layers 640 can include implanting a top portion of metal contact 238 with silicon followed by annealing the implanted top portion of metal contact 238.

Referring to FIG. 5, a masking layer 546 can be formed on the structure in FIG. 4 and patterned to expose top surfaces of metal contact 238 for implanting. Composition of masking layer 546 can include a photoresist, a hard mask, and/or other suitable materials. Masking layer 546 can be etched to form openings 548 and expose metal contact 238. Regions of semiconductor device 100 that are not implanted can be protected by masking layer 546 during the etching process. In some embodiments, openings 548 can have a diameter 548d less than horizontal dimension 238d of metal contact 238 to protect adjacent structures (e.g., S/D contact glue layer 234 and spacers 110) from implanting damage and prevent short between S/D contact structures 235 and gate structures 108.

Silicon can be implanted in metal contact 238 through openings 548 as indicated by arrows 542 to form implanted top portions 540, as shown in FIG. 5. In some embodiments, silicon can be implanted with energies ranging from about 2 keV to about 100 keV under a pressure from about 1E-8 Torr to about 1E-3 Torr. The dose of implanted silicon can range from about $1E12$ $cm^{-2}$ to about $1E18$ $cm^{-2}$. The implant process can be performed at a temperature ranging from about 20° C. to about 100° C. In some embodiments, implanted top portions 540 can have a vertical dimension 540t (e.g., thickness) along a Z-axis ranging from about 1 nm to about 20 nm. If the implant energy is less than about 2 keV, the dose is less than about $1E12$ $cm^{-2}$, or the temperature is less than about 20° C., vertical dimension 540t can be less than about 1 nm and subsequently-formed diffusion barrier layers 640 shown in FIG. 6 may not block the diffusion of the metal in metal contact 238. If the implant energy is greater than about 100 keV, the dose is greater than about 1E18 cm$^{-2}$, or the temperature is greater than about 100° C., vertical dimension 540t can be larger than about 20 nm and the contact resistance between metal contact 238 and subsequently-formed via contact structures 248A-248B shown in FIGS. 2A-2B can increase.

The implantation of silicon in metal contact 238 can be followed by annealing implanted top portions 540 to form diffusion barrier layers 640, as shown in FIG. 6. In some embodiments, forming diffusion barrier layers 640 through implanting silicon and annealing can avoid pattern loading problems (e.g., different thicknesses of deposited layers on different areas of the semiconductor devices using a deposition process) compared to depositing patterned diffusion barrier layers. Masking layer 546 can be removed prior to annealing the implanted top portions 540. In some embodiments, the annealing can be performed at a temperature ranging from about 150° C. to about 600° C. under a pressure ranging from about 1E-3 Torr to about 1520 Torr. Implanted top portions 540 can be annealed in a gas environment of nitrogen ($N_2$), hydrogen ($H_2$), argon (Ar), or helium (He). In some embodiments, the annealing time can range from about 10 s to about 300 s for a rapid thermal anneal (RTA). In some embodiments, the annealing time can range from about 5 min to about 120 min for a furnace anneal. If the annealing temperature is less than about 150° C., the RTA annealing time is less than about 10 s, or the furnace annealing time is less than about 5 min, the contact resistance between metal contact 238 and via contact structures 248A-248B can increase. If the annealing temperature is greater than about 600° C., the RTA annealing time is greater than about 300 s, or the furnace annealing time is greater than about 120 min, threshold voltage may be affected.

Figure 7:
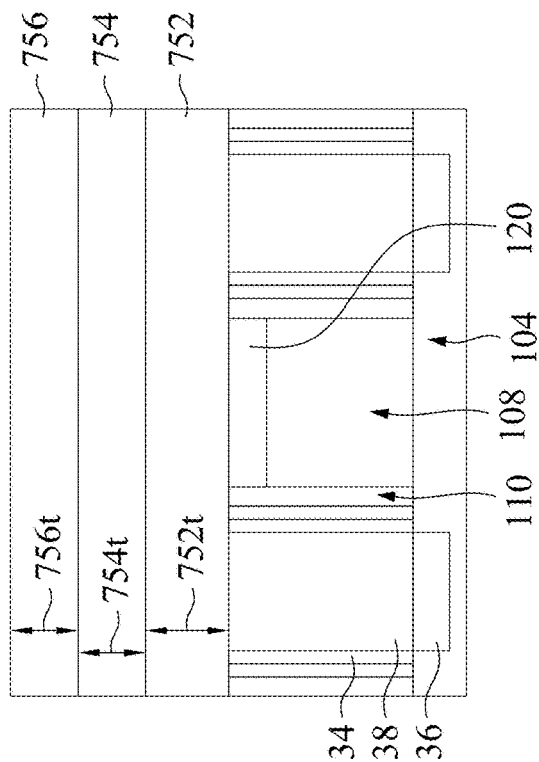

In some embodiments, diffusion barrier layers 840 can be formed by depositing a semiconductor layer including silicon followed by annealing, as shown in FIGS. 7-9. Referring to FIG. 7, a semiconductor layer 752 including silicon (e.g., a polysilicon layer) can be deposited on metal contact 238, spacers 110, and gate capping structures 120. In some embodiments, semiconductor layer 752 can be doped with a dopant (e.g., phosphorous) to further reduce the resistance of subsequently-formed diffusion barrier layers 840. In some embodiments, semiconductor layer 752 can be deposited by a CVD process with precursors including silane ($SiH_4$), phosphine ($PH_3$), and/or disilane ($Si_2H_6$). A concentration of the dopant in semiconductor layer 752 can range from about 1E10 cm$^{-3}$ to about 1E18 cm$^{-3}$. In some embodiments, semiconductor layer 752 can have a vertical dimension 752t (e.g., thickness) along a Z-axis ranging from about 2 nm to about 15 nm. If vertical dimension 752t is less than about 2 nm, subsequently-formed diffusion barrier layers 840 shown in FIG. 8 may not block the diffusion of the metal in metal contact 238. If vertical dimension 752t is greater than about 15 nm, the contact resistance between metal contact 238 and subsequently-formed via contact structures 248A-248B shown in FIGS. 2A-2B can increase.

The deposition of semiconductor layer 752 can be followed by depositing a glue layer 754 on semiconductor layer 752 and depositing a cap layer 756 on glue layer 754. Cap layer 756 can prevent outgassing of the dopant from semiconductor layer 752 during the anneal process and glue layer 754 can improve adhesion of cap layer 756 on semiconductor layer 752. In some embodiments, glue layer 754 can include Ti and cap layer 756 can include TiN. In some embodiments, glue layer 754 can have a vertical dimension 754t (e.g., thickness) along a Z-axis ranging from about 1 nm to about 5 nm. In some embodiments, cap layer 756 can have a vertical dimension 756t (e.g., thickness) along a Z-axis ranging from about 1 nm to about 100 nm. If vertical dimension 754t is less than about 1 nm, or vertical dimension 756t is less than about 1 nm, the dopant in semiconductor layer 752 may outgas and the resistance of subsequently-formed diffusion barrier layers 840 shown in FIG. 8 may increase. If vertical dimension 754t is greater than about 5 nm, or vertical dimension 756t is greater than about 100 nm, the benefits of glue layer 754 and cap layer 756 may saturate and the cost may increase.

The deposition of semiconductor layer 752, glue layer 754, and cap layer 756 can be followed by an anneal process to form diffusion barrier layers 840, as shown in FIG. 8. In some embodiments, forming diffusion barrier layers 840 through blanket deposition of semiconductor layer 572 including silicon and annealing can avoid pattern loading problems (e.g., different thicknesses of deposited layers on different areas of the semiconductor devices using a deposition process) compared to depositing patterned diffusion barrier layers. During the anneal process, silicon and the dopant in semiconductor layer 752 can diffuse to metal contact 238 and form diffusion barrier layers 840. In some embodiments, gate capping structures 120 can block the diffusion of silicon and the dopant to gate structures 108. In some embodiments, diffusion barrier layers 840 can be a silicide layer including the metal in metal contact 238 and the dopant in semiconductor layer 752. In some embodiments, the anneal process can be performed at conditions similar to the annealing of implanted top portions 540 shown in FIG. 5. In some embodiments, the anneal process can be performed at a temperature ranging from about 150° C. to about 600° C. under a pressure ranging from about 1E-3 Torr to about 1520 Torr. The anneal process can be performed in a gas environment of $N_2$, $H_2$, Ar, or He. The annealing time of the anneal process can range from about 10 s to about 300 s for an RTA and range from about 5 min to about 120 min for a furnace anneal.

The anneal process can be followed by removing semiconductor layer 752, glue layer 754, and cap layer 756, as shown in FIG. 9. In some embodiments, an etching process can remove semiconductor layer 752, glue layer 754, and cap layer 756. The etching process can be performed at a temperature ranging from about 20° C. to about 70° C. The etching process can include a dry etching process or a wet etching process. In some embodiments, the dry etching process can include etchants, such as sulfur hexafluoride ($SF_6$), chlorine ($Cl_2$), and hydrogen bromide (HBr). In some embodiments, the wet etching process can include etchants such as potassium hydroxide (KOH) and tetramethylammonium hydroxide (TMAH). In some embodiments, an etching time can range from about 10 s to about 60 min.

In some embodiments, diffusion barrier layers 840 shown in FIG. 9 can be formed by treating metal contact 238 shown in FIG. 4 in a silicon-containing gas and annealing the treated metal contact 238. As shown in FIG. 4, after the CMP process on metal contact 238, metal contact 238 can be treated in a silicon-containing gas, such as silane and disilane, under a pressure from about 1E-5 Torr to about 10 Torr. In some embodiments, a flow rate of the silicon containing gas can range from about 10 standard cubic centimeters per minute (sccm) to about 150 sccm. The treatment can be performed at a temperature from about 300° C. to about 600° C. for a time ranging from about 10 s to about 120 s. If the pressure is less than about 1E-5 Torr, the flow rate is less than about 10 sccm, the temperature is less than about 300° C., or the time is less than 10 s, subsequently-formed diffusion barrier layers 840 shown in FIG. 9 may not block the diffusion of the metal in metal contact 238. If the pressure is greater than about 10 Torr, the flow rate is greater than about 150 sccm, the temperature is greater than about 600° C., or the time is greater than 120 s, the contact resistance between metal contact 238 and subsequently-formed via contact structures 248A-248B shown in FIGS. 2A-2B can increase.

The treatment of metal contact 238 can be followed by an anneal process to form diffusion barrier layers 840, as shown in FIG. 9. In some embodiments, forming diffusion barrier layers 840 through treatment in a silicon-containing gas and annealing can avoid pattern loading problems (e.g., different thicknesses of deposited layers on different areas of the semiconductor devices using a deposition process) compared to depositing patterned diffusion barrier layers. In some embodiments, the anneal process can be performed at conditions similar to the annealing of implanted top portions 540 shown in FIG. 5. In some embodiments, the anneal process can be performed at a temperature ranging from about 150° C. to about 600° C. under a pressure ranging from about 1E-3 Torr to about 2 atm. The anneal process can be performed in a gas environment of $N_2$, $H_2$, Ar, or He. The annealing time of the anneal process can range from about 10 s to about 300 s for an RTA and from about 5 min to about 120 min for a furnace anneal.

Figures 10, 11:
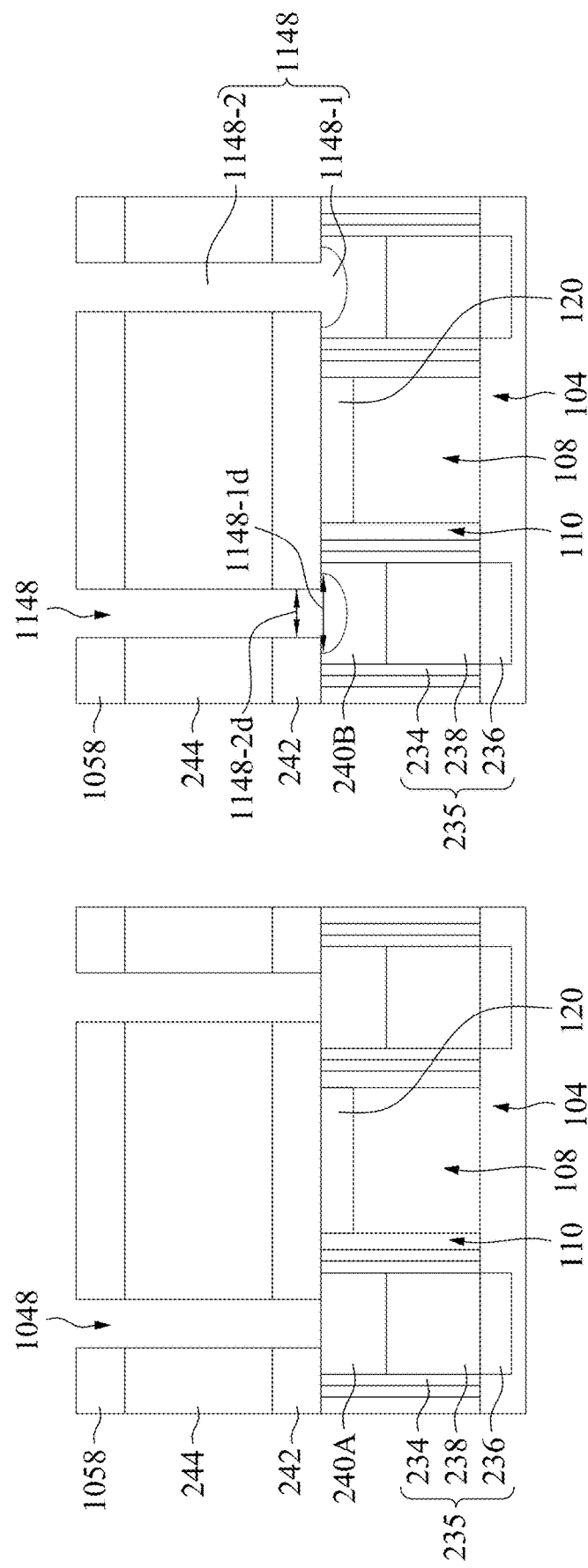

The formation of diffusion barrier layers 640 (shown in FIG. 6) and 840 (shown in FIG. 9) can be followed by a blanket deposition of ESL 242, ILD layer 244, and a masking layer 1058, as shown in FIG. 10. Masking layer 1058 can be patterned to expose diffusion barrier layers 240A, which can represent diffusion barrier layers 640 shown in FIG. 6 and diffusion barrier layers 840 shown in FIG. 9. ESL 242 and ILD layer 244 can be etched to form openings 1048 and expose diffusion barrier layers 240A. In some embodiments, via contact structures 248A can be formed in openings 1048 on diffusion barrier layers 240A, as shown in FIG. 2A. The formation of via contact structures 248A can include deposition of suitable low resistivity metal(s) followed by a CMP process. In some embodiments, via contact structures 248A can include Ru, selectively-deposited W, CVD-deposited W, ALD-deposited W, or cobalt (Co). In some embodiments, Ru-based via contact structures 248A can be formed in openings 1048 without a glue layer to further reduce the resistance of via contact structures 248A. In some embodiments, Ru-based via contact structures 248A with diffusion barrier layers 240A can reduce the resistance between Co-based S/D contact structures 235 and the interconnect structures by about 50% to about 70% compared to W-based via contact structures having similar dimensions and no diffusion barrier layer.

In some embodiments, diffusion barrier layers 240B can be etched to form a concave top surface and openings 1148 after the etch of ESL 242 and ILD layer 244, as shown in FIG. 11. Openings 1148 can include a first portion 1148-1 in diffusion barrier layers 240B and a second portion 1148-2 above diffusion barrier layers 240B in ESL 242 and ILD layer 244. The concave top surface of diffusion barrier layers 240B can increase the contact area and thereby decrease the contact resistance between diffusion barrier layers 240B and subsequently-formed via contact structures 248B shown in FIGS. 2B and 2C. In some embodiments, first portion 1148-1 can have a diameter 1148-1*d* along an X-axis ranging from about 12 nm to about 30 nm. Second portion 1148-2 can have a diameter 1148-2*d* along an X-axis ranging from about 10 nm to about 15 nm. In some embodiments, diameter 1148-1*d* can be greater than 1148-2*d* and a ratio of diameter 1148-1*d* to diameter 1148-2*d* can range from about 1.05 to about 1.7.

In some embodiments, diffusion barrier layers 240B can be etched by a wet etching process to form the concave top surface. In some embodiments, diffusion barrier layers 240B can be etched under ESL 242 by the wet etching process. The wet etching process can be performed at a temperature ranging from about 20° C. to about 70° C. The wet etching process can include etchants, such as hydrogen peroxide ($H_2O_2$), hydrochloric acid (HCl), nitric acid ($HNO_3$), and deionized water ($H_2O$). In some embodiments, an etching time can range from about 5 min to about 10 min. If the temperature is less than about 20° C. or the etching time is less than about 5 min, the concave top surface may not be formed and the contact area between diffusion barrier layers 240B and via contact structures 248B may not be increased. If the temperature is greater than about 70° C. or the etching time is greater than about 10 min, diffusion barrier layers 240B may be over etched and diffusion barrier layers 240B may not block the diffusion of the metal in metal contact 238.

The etch of diffusion barrier layers 240B can be followed by a silicon implantation process in diffusion barrier layers 240B through openings 1148. In some embodiments, the silicon implantation process is optional and can be omitted. The silicon implantation process can refill silicon in diffusion barrier layers 240B which may have a silicon loss during the etch of diffusion barrier layers 240B. The refill of silicon in diffusion barrier layers 240B can improve blocking of the metal in metal contact 238. In some embodiments, silicon can be implanted in diffusion barrier layers 240B with energies ranging from about 2 keV to about 50 keV under a pressure from about 1E-8 Torr to about 1E-2 Torr. The dose of implanted silicon can be less than about $1E16$ $cm^{-2}$. The silicon implantation process can be performed at a temperature ranging from about 20° C. to about 70° C. In some embodiments, the silicon implantation can have a depth along a Z-axis ranging from about 1 nm to about 10 nm.

The silicon implantation process can be followed by an anneal process to form metal silicides for diffusion barrier layers 240B. In some embodiments, the anneal process can be performed at conditions similar to the annealing of implanted top portions 540 shown in FIG. 5. In some embodiments, the anneal process can be performed at a temperature ranging from about 150° C. to about 600° C. under a pressure ranging from about 1E-3 Torr to about 2 atm. The anneal process can be performed in a gas environment of $N_2$, $H_2$, Ar, or He. The annealing time of the anneal process can range from about 10 s to about 300 s for an RTA and from about 5 min to about 120 min for a furnace anneal.

Figure 13:
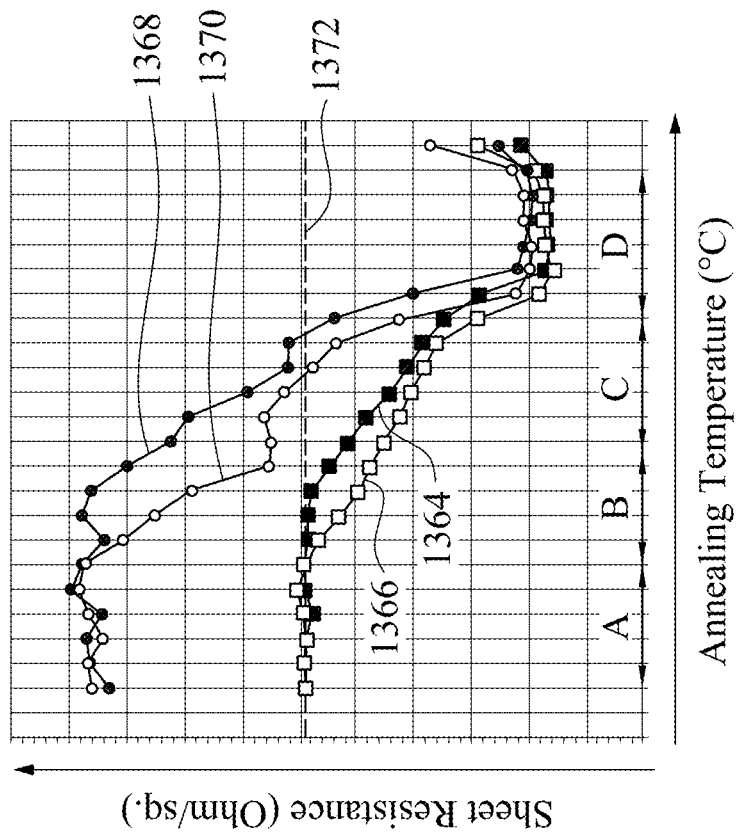
FIG. 13 illustrates a relationship between sheet resistance of a diffusion barrier layer and annealing temperatures, in accordance with some embodiments.

FIG. 13 illustrates a relationship between sheet resistance of diffusion barrier layers 240A-240B and annealing temperatures, in accordance with some embodiments. In some embodiments, as shown in FIG. 13, profiles 1364 and 1366 can represent sheet resistance of diffusion barrier layers 240A without an etch process for different annealing times (e.g., about 90 s annealing time for profile 1364 and about 130 s annealing time for profile 1366). Profiles 1368 and 1370 can represent sheet resistance of diffusion barrier layers 240B with an etch process for different annealing times (e.g., about 90 s annealing time for profile 1368 and about 130 s annealing time for profile 1370). Dotted line 1372 can represent sheet resistance of diffusion barrier layers 240A without an etch process without RTA. As shown in FIG. 13, with an increase of annealing temperature, the sheet resistance of diffusion barrier layers 240A-240B decreases and different types of cobalt silicides can be formed. For example, diffusion barrier layers 240A-240B can include silicon doped cobalt in temperature region A, dicobalt silicide ($Co_2Si$) in temperature region B, cobalt monisilicide (CoSi) in temperature region C, and cobalt disilicide ($CoSi_2$) in temperature region D. In some embodiments, diffusion barrier layers 240A-240B can include both CoSi and $CoSi_2$ after the anneal process. In some embodiments, the annealing temperature can range from about 400° C. to about 600° C. and diffusion barrier layers 240A-240B can have a higher concentration of CoSi than $CoSi_2$ as a result of the annealing temperature.

The anneal process of diffusion barrier layers 240B can be followed by formation of via contact structures 248B in openings 1148 on diffusion barrier layers 240B, as shown in FIGS. 2B and 2C. The formation of via contact structures 248B can include deposition of suitable low resistivity metal(s) followed by a CMP process. In some embodiments, via contact structures 248B can include Ru, selectively-deposited W, CVD-deposited W, ALD-deposited W, or Co. In some embodiments, Ru-based via contact structures 248B can be formed in openings 1048 without a glue layer to further reduce the resistance of via contact structures 248B. In some embodiments, Ru-based via contact structures 248B with diffusion barrier layers 240B can reduce the resistance between Co-based S/D contact structures 235 and the interconnect structures by about 50% to about 70% compared to W-based via contact structures having similar dimensions and no diffusion barrier layer.

Various embodiments in the present disclosure provide example structures and methods for forming diffusion barrier layers (e.g., diffusion barrier layers 240A and 240B) on S/D contact structures 235 to block a diffusion of a metal from S/D contact structures 235 to via contact structures (e.g., via contact structures 248A and 248B). In some embodiments, diffusion barrier layers 240A and 240B can be formed by implanting a top portion of S/D contact structures 235 and anneal the implanted top portion of S/D contact structures 235. In some embodiments, diffusion barrier layers 240A and 240B can be formed by treating S/D contact structures 235 with a silicon-containing gas and anneal the treated S/D contact structures 235. In some embodiments, diffusion barrier layers 240A and 240B can be formed by depositing semiconductor layer 752 on S/D contact structures 235, glue layer 754 on semiconductor layer 752, and cap layer 756 on glue layer 754 followed by an anneal process. Semiconductor layer 752 can include silicon and a dopant to diffuse into S/D contact structures 235 and form doped diffusion barrier layers 240A and 240B. The dopant in doped diffusion barrier layers 840 can reduce the resistance of diffusion barrier layers 840. Cap layer 756 can prevent the dopant outgassing from semiconductor layer 752 during the anneal process and glue layer 754 can improve adhesion of cap layer 756 on semiconductor layer 752. In some embodiments, diffusion barrier layers 240A and 240B can be formed on semiconductor device 100 without pattern loading problems compared to depositing patterned diffusion barrier layers.

In some embodiments, S/D contact structures 235 can include a metal (e.g., Co) and diffusion barrier layers 240A and 240B can include silicon and the metal (e.g., cobalt silicides) to block the diffusion of the metal. In some embodiments, via contact structures 248A and 248B can include another metal (e.g., Ru) having a lower resistivity than W to reduce the resistance between semiconductor device 100 and interconnect structures. In some embodiments, via contact structures 248B can have first portion 248B-1 in diffusion barrier layers 240B and second portion 248B-2 above diffusion barrier layers 240B. First portion 248B-1 can have a diameter larger than the second portion 248B-2, thereby reducing contact resistances between diffusion barrier layers 240B and the via contact structures 248B and further reducing the resistance between semiconductor device 100 and the interconnect structures. In some embodiments, Ru-based via contact structures 248A-248B with diffusion barrier layers 240A-240B can reduce the resistance between semiconductor device 100 and the interconnect structures by about 50% to about 70% compared to W-based via contact structures with similar dimensions and no diffusion barrier layer.

In some embodiments, a method includes forming a source/drain (S/D) region on a fin structure, forming on the S/D region a S/D contact structure including a metal, forming on the S/D contact structure a barrier layer that includes silicon and the metal, and forming a via contact structure on the barrier layer. The barrier layer blocks a diffusion of the metal in the S/D contact structure to the via contact structure.

In some embodiments, a method of fabricating a semiconductor device includes forming a source/drain (S/D) region on a fin structure, forming on the S/D region a first silicide layer, forming on the first silicide layer a metal contact that includes a first metal, forming on the metal contact a second silicide layer that includes the first metal, and forming on the second silicide layer a via contact structure that includes a second metal different from the firs metal. The second silicide layer blocks a diffusion of the first metal in the metal contact to the via contact structure.

In some embodiments, a semiconductor device includes a source/drain (S/D) region disposed on a fin structure, a first silicide layer disposed on the S/D region, a metal contact disposed on the first silicide layer and including a metal, a second silicide layer disposed on the metal contact and including the metal, and a via contact structure disposed on the second silicide layer. The second silicide layer blocks a diffusion of the metal in the metal contact to the via contact structure.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
  forming a source/drain (S/D) region on a fin structure;

forming, on the S/D region, a S/D contact structure comprising a first metal and a glue layer;

forming, on the S/D contact structure, a barrier layer that comprises silicon and the first metal, wherein the barrier layer is in physical contact with a sidewall surface of the glue layer; and forming, on the barrier layer, a via contact structure comprising a second metal different from the first metal, wherein the barrier layer blocks a diffusion of the first metal in the S/D contact structure to the via contact structure.

2. The method of claim 1, wherein the forming the barrier layer comprises:

implanting a top portion of the S/D contact structure with silicon; and annealing the S/D contact structure to form the barrier layer.

3. The method of claim 1, wherein the forming the barrier layer comprises:

treating the S/D contact structure with a silicon-containing gas; and annealing the treated S/D contact structure to form the barrier layer.

4. The method of claim 1, wherein the forming the barrier layer comprises:

depositing a semiconductor layer comprising silicon on the S/D contact structure;

depositing an additional glue layer on the semiconductor layer;

depositing a cap layer on the additional glue layer; and annealing the semiconductor layer and the S/D contact structure to form the barrier layer.

5. The method of claim 4, further comprising diffusing a dopant in the semiconductor layer into the barrier layer.

6. The method of claim 4, further comprising removing the cap layer, the additional glue layer, and the semiconductor layer.

7. The method of claim 1, wherein the forming the via contact structure comprises:

etching a portion of the barrier layer to form a concave top surface of the barrier layer; and forming the via contact structure on the concave top surface.

8. The method of claim 7, wherein the forming the via contact structure further comprises:

implanting the concave top surface of the barrier layer with silicon; and annealing the barrier layer implanted with silicon.

9. The method of claim 1, wherein the forming the via contact structure comprises:

depositing an etch stop layer on the barrier layer;

depositing an interlayer dielectric (ILD) layer on the etch stop layer;

etching the ILD layer and the etch stop layer over the barrier layer to form a first opening;

etching a portion of the barrier layer to form a second opening having a concave top surface, wherein the second opening is connected to the first opening and has a diameter greater than the first opening; and forming the via contact structure in the first and second openings.

10. The method of claim 1, wherein the forming the via contact structure comprises:

depositing an etch stop layer on the barrier layer;

depositing an interlayer dielectric (ILD) layer on the etch stop layer;

etching the ILD layer and the etch stop layer over the barrier layer to form an opening; and forming the via contact structure in the opening.

11. A semiconductor device, comprising:

a source/drain (S/D) region on a fin structure;

a S/D contact structure on the S/D region, wherein the S/D contact structure comprises a metal and a glue layer;

a barrier layer on the S/D contact structure and in physical contact with a sidewall surface of the glue layer, wherein the barrier layer comprises silicon and the metal; and a via contact structure on the barrier layer, wherein the barrier layer blocks a diffusion of the metal in the S/D contact structure to the via contact structure.

12. The semiconductor device of claim 11, wherein the barrier layer comprises a dopant.

13. The semiconductor device of claim 11, wherein the via contact structure comprises a first portion in the barrier layer and a second portion above the barrier layer, and wherein a diameter of the first portion is greater than that of the second portion.

14. The semiconductor device of claim 11, wherein the via contact structure comprises an additional metal different from the metal in the S/D contact structure.

15. The semiconductor device of claim 11, wherein the barrier layer comprises cobalt monosilicide and cobalt disilicide, and wherein a concentration of the cobalt monosilicide is greater than that of the cobalt disilicide.

16. A semiconductor device, comprising:

a source/drain (S/D) region on a fin structure;

a S/D contact structure on the S/D region, wherein the S/D contact structure comprises a metal and a glue layer;

a barrier layer on the S/D contact structure and comprising silicon and the metal, wherein top surfaces of the glue layer and the barrier layer are coplanar;

a dielectric layer on the top surfaces of the glue layer and barrier layer; and a via contact structure extending through the dielectric layer and in contact with the barrier layer, wherein the barrier layer blocks a diffusion of the metal in the S/D contact structure to the via contact structure.

17. The semiconductor device of claim 16, wherein the barrier layer comprises a dopant.

18. The semiconductor device of claim 16, wherein the via contact structure comprises a first portion in the barrier layer and a second portion in the dielectric layer, and wherein a diameter of the first portion is greater than that of the second portion.

19. The semiconductor device of claim 16, wherein the via contact structure comprises an additional metal different from the metal in the S/D contact structure.

20. The semiconductor device of claim 16, wherein the barrier layer comprises cobalt monosilicide and cobalt disilicide, and wherein a concentration of the cobalt monosilicide is greater than that of the cobalt disilicide.

* * * * *